US00RE51058E

(19) United States
(12) Reissued Patent
Giuliano

(10) Patent Number: US RE51,058 E
(45) Date of Reissued Patent: Oct. 6, 2026

(54) SWITCHED-CAPACITOR NETWORK PACKAGED WITH LOAD

(71) Applicant: pSemi Corporation, San Diego, CA (US)

(72) Inventor: David Giuliano, San Diego, CA (US)

(73) Assignee: pSemi Corporation, San Diego, CA (US)

(21) Appl. No.: 17/372,392

(22) Filed: Jul. 9, 2021

Related U.S. Patent Documents

Reissue of:
(64) Patent No.: 10,348,191
Issued: Jul. 9, 2019
Appl. No.: 15/779,238
Filed: May 25, 2018

U.S. Applications:
(60) Provisional application No. 62/259,823, filed on Nov. 25, 2015.

(51) Int. Cl.

| | |
|---|---|
| ***G05F 1/10*** | (2006.01) |
| ***H01L 23/00*** | (2006.01) |
| ***H01L 23/64*** | (2006.01) |
| ***H01L 25/00*** | (2006.01) |
| ***H01L 25/065*** | (2023.01) |
| ***H01L 25/10*** | (2006.01) |
| ***H01L 25/16*** | (2023.01) |
| ***H02J 7/00*** | (2026.01) |
| ***H02M 1/00*** | (2007.01) |
| ***H02M 3/07*** | (2006.01) |
| ***H02M 3/155*** | (2006.01) |

(Continued)

(52) U.S. Cl.
CPC ..... *H02M 3/07* (2013.01); *H02M 3/155* (2013.01); *H02M 3/335* (2013.01); *H10W 44/00* (2026.01); *H10W 70/60* (2026.01); *H10W 90/00* (2026.01); *H02M 1/007* (2021.05); *H10W 72/241* (2026.01); *H10W 72/252* (2026.01); *H10W 72/877* (2026.01); *H10W 74/15* (2026.01); *H10W 90/288* (2026.01); *H10W 90/291* (2026.01); *H10W 90/724* (2026.01); *H10W 90/734* (2026.01)

(58) Field of Classification Search
CPC ..... H02M 3/07; H02M 3/155; H02M 3/335; H02M 2001/007; H01L 23/64; H01L 24/20; H01L 24/13; H01L 24/16; H01L 24/73; H01L 25/105; H01L 25/16; H01L 25/50
USPC ..... 327/536
See application file for complete search history.

(56) References Cited

U.S. PATENT DOCUMENTS 5,602,794 A * 2/1997 Javanifard ..... G11C 5/145 257/299
7,397,677 B1 7/2008 Collins et al.
(Continued)

FOREIGN PATENT DOCUMENTS

TW 201635479 A * 10/2016 ..... H01L 21/78
WO WO-2006039048 A2 * 4/2006 ..... H01F 37/00
WO WO 2015/138378 9/2015

*Primary Examiner* — My Trang Ton
(74) *Attorney, Agent, or Firm* — Haynes and Boone, LLP

(57) ABSTRACT

An apparatus comprises a charge pump packaged with a load that receives charge provided by the charge pump, the charge pump comprising a plurality of switches that, when connected to a plurality of capacitors, cause the plurality of capacitors to assume a selected configuration, wherein the switches are configured to cause transitions between configurations of the capacitors.

34 Claims, 7 Drawing Sheets

(51) Int. Cl.

| | |
|---|---|
| ***H02M 3/335*** | (2006.01) |
| ***H10W 44/00*** | (2026.01) |
| ***H10W 70/60*** | (2026.01) |
| ***H10W 90/00*** | (2026.01) |
| *H10W 72/00* | (2026.01) |
| *H10W 72/20* | (2026.01) |
| *H10W 74/15* | (2026.01) |
| *H10W 90/20* | (2026.01) |

(56) References Cited

U.S. PATENT DOCUMENTS 7,545,127 B2 * 6/2009 Takahashi ..... G05F 1/575 323/276
7,642,797 B2 * 1/2010 Kojima ..... G01R 31/31721 324/73.1
7,656,740 B2 * 2/2010 Yu ..... G11C 16/08 365/189.09
7,956,673 B2 * 6/2011 Pan ..... H02M 3/07 327/530
8,154,333 B2 * 4/2012 Ker ..... G11C 5/145 327/536
8,274,322 B2 * 9/2012 Chang ..... H02M 3/07 327/536
8,339,102 B2 * 12/2012 Kushnarenko ..... H02M 3/073 320/132
8,674,545 B2 * 3/2014 Signorelli ..... H01L 31/02021 307/61
8,743,574 B2 * 6/2014 Roy ..... H02J 3/32 363/59
8,867,281 B2 * 10/2014 Tran ..... G11C 5/145 365/185.33
8,874,828 B2 * 10/2014 Fai ..... G11C 16/12 711/103
9,658,635 B2 * 5/2017 Szczeszynski ..... G05F 3/02
10,128,745 B2 * 11/2018 Low ..... H02M 3/07
2004/0212074 A1 * 10/2004 Divakar ..... H02M 3/1588 257/691
2009/0066407 A1 3/2009 Bowman et al.
2009/0160482 A1 * 6/2009 Karp ..... G06F 30/39 438/109
2011/0130721 A1 * 6/2011 Foster ..... B81C 1/0023 607/9
2012/0249224 A1 10/2012 Wei et al.
2012/0250443 A1 * 10/2012 Saraswat ..... G06F 1/3275 365/226
2015/0002195 A1 * 1/2015 Englekirk ..... H03L 7/0891 327/157
2015/0188420 A1 7/2015 Lin
2016/0090298 A1 * 3/2016 Sengupta ..... B81B 7/0048 438/51

* cited by examiner

SWITCHED-CAPACITOR NETWORK PACKAGED WITH LOAD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATIONS

This application *is a reissue application of U.S. application Ser. No. 15/779,238, filed May 25, 2018, now U.S. Pat. No. 10,348,191, which* is the national phase under 35 USC 371 of international application no. PCT/US2016/063533 filed Nov. 23, 2016, which claims the benefit of the Nov. 25, 2015 priority date of U.S. Provisional Application No. 62/259,823, the contents of which are incorporated herein by reference *in their entirety*.

FIELD OF INVENTION

The invention relates to power converters, and in particular, to power converters that rely on switched-capacitor networks.

BACKGROUND

Many modern electronic devices rely on a stable source of power. In many cases, a power source, such as a battery, does not provide an appropriate voltage or current. Accordingly, it is useful to provide circuitry that will condition that power so that it is suitable for use by the device. A device that provides such power is often referred to as a "power converter."

A known power converter includes a regulator in series with a charge pump. An example of such a regulator operates by switching an inductor between two states according to some switch duty cycle. The inductor in this regulator performs two functions. One is to control the output voltage of the converter. The other is to promote adiabatic charge transfer among the capacitors within the charge pump.

Known power converters operating according to the above principles are described in U.S. Pat. Nos. 8,860,396, 8,743,553, 8,503,203, 8,693,224, 8,339,184, 8,619,445, 8,723,491, 8,817,501, 9,497,854, 9,143,037, 8,724,353, 9,502,968, 9,203,299, 9,041,459 and U.S. Publication No. 2013-0229841, U.S. Publication No. 2013-0094157, U.S. Publication No. 2013-0154600, U.S. Publication No. 2015-0311786, U.S. Publication No. 2014-0327479, U.S. Publication No. 2016-0028302, U.S. Publication No. 2014-0266132, U.S. Publication No. 2015-0077175, U.S. Publication No. 2015-0077176, U.S. Publication No. 2016-0197552 and International Publication No. 2014/062279, International Publication No. 2015/138378, 2015/138547, International Publication No. 2016/149063 the contents of which are all herein incorporated by reference in their entirety.

SUMMARY

The invention includes novel circuit arrangements in which a switched-capacitor converter is coupled to a regulator.

In one aspect, the invention features a power converter comprising a charge pump and a regulator together with a controller for controlling the charge pump and the regulator.

In some embodiments, the regulator connects to an output of the charge pump. In others, the regulator is coupled to an input of the charge pump and a magnetic filter is coupled to an output of the charge pump.

Some embodiments include a die, such as a processor die. Among these are embodiments in which the power converter is mounted beneath the die. Also among these are embodiments that further include a first active component, a second active component, and corresponding passive components, with the first and second active components being beside the die, and the corresponding passive components being beneath the die.

In some embodiments, a die, active components, and corresponding passive components together define a packaged processor. Among these embodiments are those in which the packaged processor is configured to be mated to a socket and those in which the packaged processor is configured to be soldered directly to a motherboard.

In one aspect, the invention features a power converter that includes a power-converter controller, a charge pump, and a regulator. The power-converter controller includes a regulator-controller that controls the regulator and a charge-pump controller that controls the charge pump.

In some embodiments, the regulator connects to an output of the charge pump.

In other embodiments, the power converter further includes a magnetic filter, the regulator couples to an input of the charge pump, and the magnetic filter couples to an output of the charge pump.

Also among the embodiments are those that include a printed-circuit board having first and second opposed faces, a motherboard, solder bumps, and a first die. The first die, which includes circuitry that consumes power provided by the power converter, protrudes from the first face. Meanwhile, the power converter protrudes from the second face, though not by as much as the solder bumps protrude from the second face. As a result, when the printed-circuit board is mounted to the motherboard with the second face facing the motherboard, a gap formed by the solder bumps accommodates the power converter.

Other embodiments include a printed-circuit board having first and second opposed faces, a motherboard, and a first die that includes circuitry that consumes power provided by the power converter. The first die protrudes from the first face and the power converter protrudes from the second face. When the printed-circuit board is mounted to the motherboard with the second face facing the motherboard, the hole in the motherboard accommodates the power converter.

Yet other embodiments include a printed-circuit board having first and second opposed faces, a motherboard, a socket layer, and a first die. The first die, which includes circuitry that consumes power provided by the power converter, protrudes from the first face, Meanwhile, the power converter protrudes from the second face. When the printed-circuit board is mounted to the socket layer with the second face facing the motherboard, a recess defined by the socket layer on the motherboard accommodates the power converter.

Other embodiments include a printed-circuit board having opposed first and second faces, a motherboard, and a first die. Active elements of the power converter are in a second die. The first die, which includes circuitry that consumes power provided by the power converter, and the second die both protrude from the first face. The power-converter's passive components protrude from the second face. When the printed-circuit board is mounted to the motherboard with the second face facing the motherboard, an accommodation space defined by the motherboard accommodates the passive components.

Yet other embodiments include a printed-circuit board with first and second opposed faces, a motherboard, and a first die. In these embodiments, the power converter includes active components spread across plural second dies and passive components. Both the first die, which includes circuitry that consumes power provided by the power converter, and the second die protrude from the first face. Meanwhile, the passive components protrude from the second face. When the printed-circuit board is mounted to the motherboard with the second face facing the motherboard, an accommodation space defined by the motherboard accommodates the passive components. Among these embodiments are those that also include a heat spreader disposed to be in thermal communication with both the first die and at least one second die.

Also among the embodiments are those that include a printed-circuit board having opposed first and second faces, a first die protruding from the first face, and at least a portion of the power converter protruding from the second face. The printed-circuit board is mounted to be in electrical communication with the motherboard. When the second face faces the motherboard, an accommodation space receives at least a portion of the power converter.

Among the embodiments are those in which the power converter includes a second die, a charge-transfer capacitor, and an inductor. The power-converter controller includes circuitry on the second die. In these embodiments, the charge-transfer capacitor is a constituent of the charge pump and the inductor is a constituent of the regulator. The second die, the inductor, and the charge-transfer capacitor are mounted on the first face of the printed-circuit board.

Also among these embodiments are those in which the power converter includes a package that includes a substrate that defines an upper layer and a lower layer, a second die, a charge-transfer capacitor, and an inductor. The power-converter controller includes circuitry on the second die. In these embodiments, the charge-transfer capacitor is a constituent of the charge pump and the inductor is a constituent of the regulator. The package is mounted on the first face of the printed-circuit board. Within the package, the second die is integrated into the lower layer and the charge-transfer capacitor is integrated into the upper layer. Among these are embodiments in which the power converter further includes first and second interconnect layers within the package, with the second die having a device face that faces the first interconnect layer. The first interconnect layer is connected to the printed-circuit board to provide a connection to the second die and to the second interconnect layer. The second interconnect layer connects to components in the upper layer. Also among these embodiments are those in which the inductor is mounted to the printed-circuit board, those in which the inductor is in the package, those in which the inductor is in the lower layer, those in which the inductor is in the upper layer, and those in which the inductor is embedded in the printed-circuit board.

Also among the foregoing embodiments are those in which the power converter further includes first and second interconnect layers within the package. In these embodiments, the second die has a device face that faces the second interconnect layer. The first interconnect layer connects to the printed-circuit board to provide a connection to the second interconnect layer, and the second interconnect layer connects to components in the upper layer and to the second die. Among these embodiments are those in which the power converter further includes thermally-conducting bumps configured to provide a path for heat to flow from the second die to the printed-circuit board and those in which the power converter further includes a thermally-conducting pad configured to provide a path for heat to flow from the second die to the printed-circuit board.

In any of the embodiments that include a die, the die can take several forms, including, but not limited to, a microprocessor, an array of logic gates and a clock, wherein the array is configured to load and execute instructions in synchrony with a clock signal provided by the clock, and an array of programmable logic gates.

In another aspect, the invention features a charge pump packaged with a load that receives charge provided by the charge pump. The charge pump has a plurality of switches that, when connected to a plurality of capacitors, cause the plurality of capacitors to assume a selected configuration. The switches are configured to cause transitions between the configurations of the capacitors. The charge pump comprises a first terminal and a second terminal and transforms a first voltage at the first terminal into a second voltage at the second terminal.

In some embodiments, the charge pump has a controllable adiabaticity.

Also among the embodiments are those having a communication link between a controller of the charge pump and the load to receive instructions from the load.

Yet other embodiments include those that have either a regulator, a magnetic filter, a switching regulator, or a buck converter connected to the charge pump.

Incorporating the load and the power converter into the same package offers numerous advantages. The output of a real power converter inevitably has some ripple. When a voltage having ripple traverses an extended path, it typically encounters inductance. This inductance will tend to distort the voltage, thus making it more difficult to maintain a precise value of voltage. By eliminating the extended path between the power converter and the load, one can maintain a desired voltage with more accuracy.

However, this is only the beginning of the advantages associated with such integration.

First of all, the ability to more tightly control the output voltage lets loose a cascade of other advantages. For example, as soon as one can control output voltage with great precision, it suddenly becomes possible to offer the load a menu of different voltages that are fairly close together. This is an important feature because there are many applications in which a load may need different voltages at different times.

Eliminating the inductance also eliminates the need to include capacitors that would otherwise be needed to compensate for it. This, in turn, reduces both size and cost of the system.

Yet another advantage is modularity. When a power converter is on the motherboard, the details of the motherboard will depend a great deal on the load. As a result, it is generally not possible to swap a different load into the same motherboard without considerable redesign. Once the power converter and the load are integrated into the same package, the coupling between the power converter and the load becomes encapsulated into the package, and no longer significantly impacts the details of the motherboard. This makes design of the motherboard simpler.

Yet another advantage arises from avoiding the delivery of power at a low voltage. Many common loads, such as microprocessors, require relatively low voltages. Among the tasks of a power converter is to take a relatively high voltage and step it down to a value that the load needs. When the load and power converter are far from each other, power at low voltage and high current must be transferred across a long distance. By placing the power converter and the load in the same package, the path that is traversed by the low voltage power becomes much shorter, thus reducing losses.

Yet another advantage arises from the fact that one can reduce the number of pins when high voltage power is received. This is particularly important for pins that handle power. This is because each pin introduces a certain amount of inductance. Thus, one way to reduce overall inductance is to place a great many pins in parallel. This is particularly important when large currents are present, as would be the case when power is delivered at low voltage. By delivering power at high voltage, one can reduce the current, and hence the number of pins required to carry that current.

BRIEF DESCRIPTION OF THE FIGURES

These and other features of the invention will be apparent from the following figures, in which.

DETAILED DESCRIPTION

Figure 1:
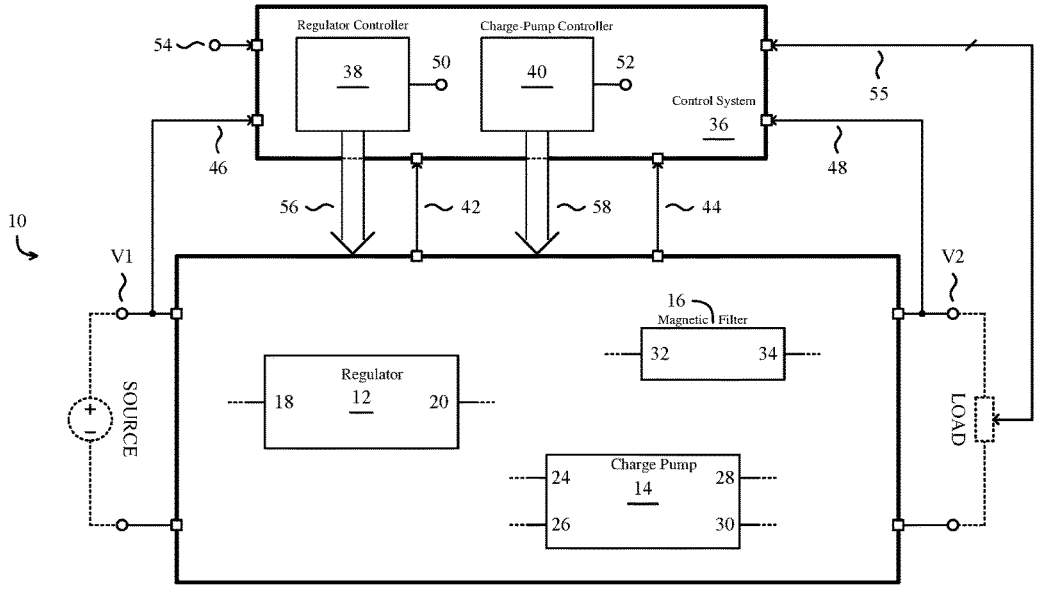
FIG. 1 shows a power converter having a controller.

FIG. 1 shows a power converter 10 having a first terminal maintained at a first voltage V1 by a source. Examples of a source include a power supply, a battery, a stack of batteries, and another power converter.

The power converter 10 transforms this first voltage V1 into a stable second voltage V2 at a second terminal thereof. It presents this second voltage V2 to a load for consumption. Examples of a load include a processor, a field-programmable gate array, or any of a variety of electronic devices that require one or more stable output voltages.

Neither the load nor the source is a part of the power converter 10. These structures are shown only as an aid to understanding. To further emphasize that the load and source are not part of the power converter, these structures have been shown in phantom with dashed lines.

In the illustrated embodiment, the load is shown as connected to the second terminal and the source is shown as connected to the first terminal. These structures are shown connected this way only as an aid to understanding. There is no particular prohibition against connecting the source to the second terminal and the load to the first terminal.

In many applications, the load will require different voltages, possibly at different times. To accommodate such applications, the power converter 10 includes a control bus 55. Embodiments include those in which the control bus 55 is an analog control bus and those in which it is a digital control bus. The control bus 55 permits a load to communicate with the power converter 10, thus enabling the load to request the voltage that it needs. Thus, many practical implementations of the power converter 10 will include several outputs, each connected to different combinations of components so as to be able to provide different output voltages to accommodate different load requirements. Alternatively, it is possible to provide multiple power converters 10, each tuned to provide a different output voltage, so as to accommodate different load requirements.

The power converter 10 includes several modules, namely: a regulator 12, a charge pump 14, and a magnetic filter 16. The regulator 12 includes a regulator input 18 and a regulator output 20. The charge pump 14 includes first, second, third, and fourth charge-pump terminals 24, 26, 28, 30. The magnetic filter 16 includes a magnetic-filter input 32 and a magnetic-filter output 34.

Figure 2:
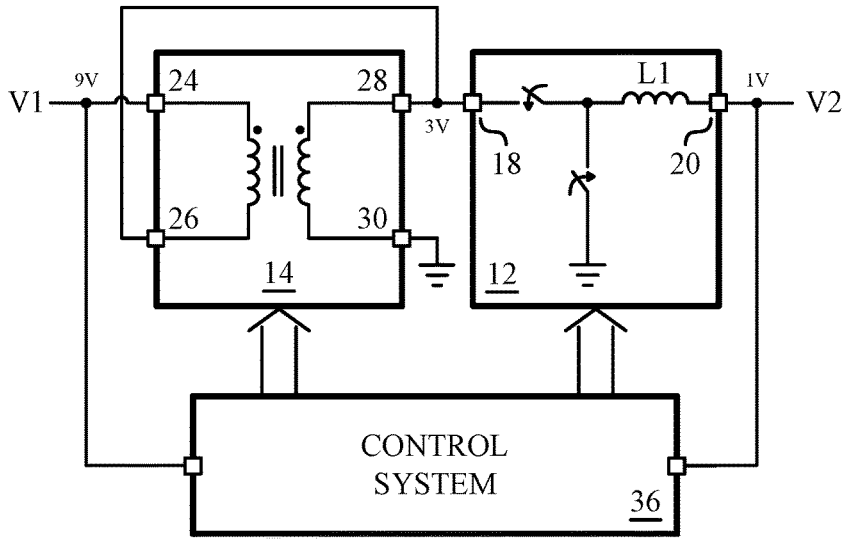
FIGS. 2-4 show different power conversion architectures for the power converter shown in FIG. 1.
Figure 3:
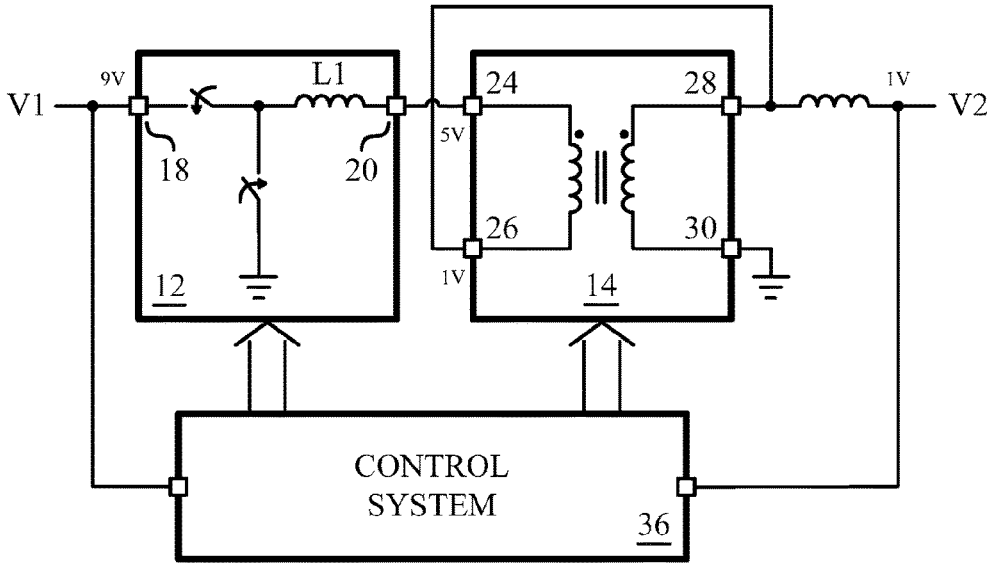
Figure 4:
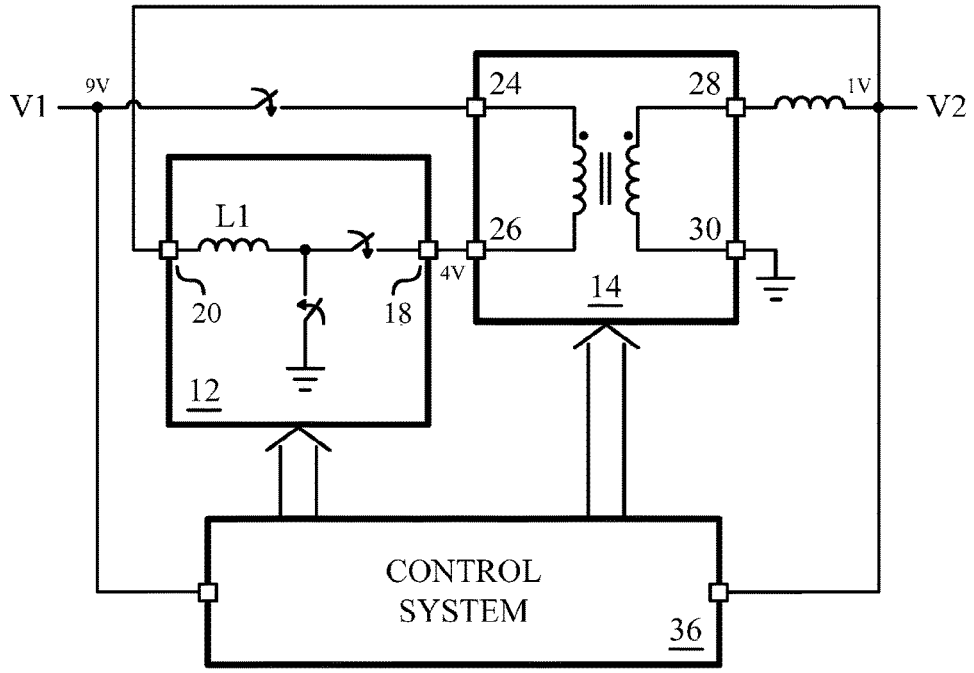

The foregoing modules can be connected to each other in a variety of ways. For this reason, no specific connection is shown in FIG. 1. However, FIGS. 2-4 show particular combinations of these modules. As is apparent from its absence in FIG. 2, the magnetic filter 16 is an optional feature. Although the embodiments shown in FIGS. 2-4 have one charge pump and one regulator each, this is by no means required. It is possible to mix and match the various components to achieve particular performance specifications. Thus, it is possible to have a power converter that uses two regulators and one charge pump or vice versa.

The regulator 12 and the charge pump 14 include switches that, during operation, open and close at particular times relative to each other. These times, however, cannot always be predicted in advance. As a result, it is useful to provide a control system 36 having a regulator controller 38 and a charge-pump controller 40. The control system 36 ensures that various voltages, such as the first voltage V1 and/or the second voltage V2, remain within a relatively tight tolerance of a desired value. The control system 36 also controls the startup and shutdown sequence of the power converter 10 and in the event of a fault condition, such as over-voltage or over-current of a node.

To carry out their control functions, the regulator controller 38 and the charge-pump controller 40 receive feedback via first and second feedback lines 42, 44 for providing feedback from the charge pump 14 and regulator 12. The regulator controller 38 and the charge-pump controller 40 also rely on third and fourth feedback lines 46, 48 connected to the first and second terminals of the power converter 10.

The regulator controller 38 provides regulator-control instructions 56 to the regulator 12. Similarly, the charge-pump controller 40 provides charge-pump-control instructions 58 to the charge pump 14. Both the regulator-control instructions 56 and the charge-pump-control instructions 58 are based on feedback received from the various feedback lines 42, 44, 46, 48 and synchronized based on an external clock-signal 54 and first and second control signals 50, 52.

Among the embodiments of the power converter 10 are those in which the regulator 12 comprises a converter with the ability to regulate the output voltage. Also among the embodiments are those that include a switching regulator. Among these embodiments are those that rely on a buck converter. Such converters are particularly attractive because of their speed and high efficiency. Other suitable converters include boost converters, buck/boost converters, fly-back converters, forward converters, half-bridge converters, full-bridge converters, Cuk converters, resonant converters, and linear regulators. Among the embodiments that use a fly-back converter are those that use a quasi-resonant fly-back converter, those that use an active-clamp fly-back converter, those that use an interleaved fly-back converter, and those that use a two-switch fly-back converter. Among the embodiments that use a forward converter are those that use a multi-resonant forward converter, those that use an active-clamp forward converter, those that use an interleaved forward converter, and those that use a two-switch forward converter. Among the embodiments that use a half-bridge converter are those that use an asymmetric half-bridge converter, those that use a multi-resonant half-bridge converter, and those that use a LLC resonant half-bridge.

In some embodiments, the charge pump 14 comprises a switched-capacitor network or switching-capacitor network. Among the more useful switched-capacitor topologies are: Ladder, Dickson, Series-Parallel, Fibonacci, and Doubler, all of which can be adiabatically charged and configured into multi-phase networks. A particularly useful switching-capacitor network is an adiabatically charged version of a full-wave cascade multiplier. However, diabatically charged versions can also be used.

In any power-converter architecture, size and efficiency can be traded off. For example, a given power converter can be made more efficient by making it larger. Conversely, it can be made smaller by making it less efficient. FIGS. 2-4 illustrate three different embodiments of the power converter architecture shown in FIG. 1. Each of these embodiments was devised to improve upon the efficiency-size trade off of traditional power-converter topologies.

FIG. 2 shows a first embodiment in which the power converter 10 receives an input voltage V1 at its input terminal and transforms it into an output voltage V2 at its output terminal. The first embodiment features a charge pump 14 that receives the input voltage V1 at its first terminal 24 and outputs an intermediate voltage at its third terminal 28. This intermediate voltage is provided to the regulator's input 18, which ultimately maintains, at its output 20, the power converter's output voltage V2. In the illustrated embodiment, the input voltage is nine volts, the output voltage is one volt, and the intermediate voltage is three volts.

In the first embodiment, the charge pump's third terminal 28 connects to its second terminal 26, which therefore also receives the intermediate voltage. The charge pump's fourth terminal 30 is grounded.

FIG. 3 shows a second embodiment similar to the first embodiment but with the charge pump 14 and regulator 12 having swapped locations. In this second embodiment, the regulator's input 18 receives the input voltage V1 and provides a first intermediate voltage at its output 20. This intermediate voltage is received by the charge pump's first terminal 24. The charge pump 14 then outputs a second intermediate voltage via its third terminal 28, which connects to the magnetic filter's input 32. This third terminal 28 also connects to the charge pump's second terminal 26, which therefore also sees the second intermediate voltage. The magnetic filter's output 34 maintains the power converter's output V2. In this embodiment, the input voltage V1 is nine volts, the output voltage V2 is one volt, the first intermediate voltage is five volts, and the second intermediate voltage is one volt.

FIG. 4 shows a third embodiment in which the charge pump's first terminal 24 receives an input voltage V1 and the charge pump's second terminal 26 receives an intermediate voltage provided at the regulator's output 20. The regulator's input 18 in this embodiment is fed back from a magnetic filter's output 34. As was the case in the second embodiment, the charge pump's third terminal 28 connects to the magnetic filter's input 32. In this embodiment, the input voltage V1 is nine volts, the intermediate voltage is four volts, and the output voltage V2 is one volt.

Figure 5:
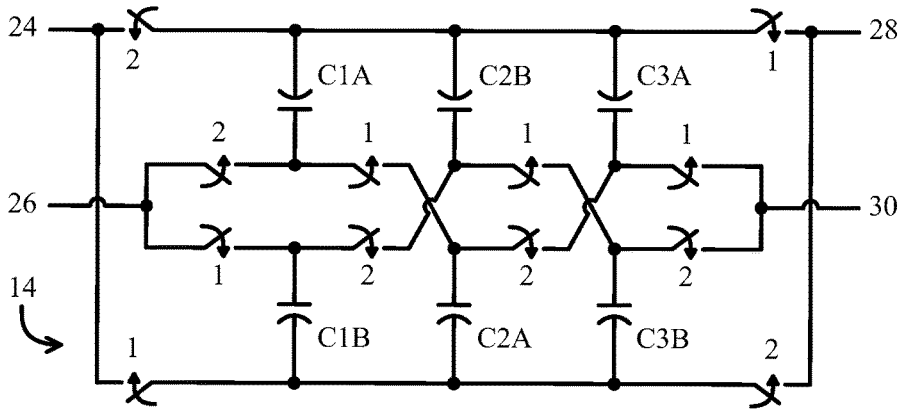
FIG. 5 shows an embodiment of the charge pump in FIGS. 2-4.

A typical charge pump 14 for this and other embodiments is a switched-capacitor network or switching network as shown in FIG. 5. The charge pump includes a first set of switches 1 and a second set of switches 2. These are operated such that, except for a brief dead-time interval, the first set of switches 1 and the second set of switches 2 are in opposite states. These switches 1,2 selectively interconnect capacitors C1A, C2A, C3A, C1B, C2B, C3B to cause the circuit to transition between two states.

Figure 6:
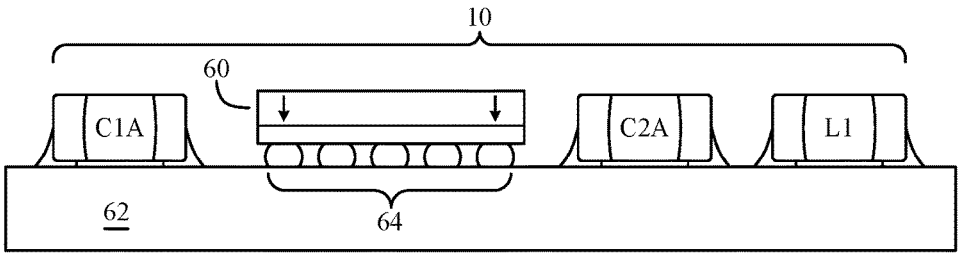
FIG. 6 shows a side-view of an implementation of one of the architectures shown in FIGS. 2-4 in which all components are on a printed-circuit board.

FIG. 6 shows a side-view of an implementation of one of the architectures shown in FIGS. 2-4. The power-converter 10 includes an inductor L1 corresponding to that in the regulator 12 of FIGS. 2-4 and charge-transfer capacitors C1A, C2A, C3A, C1B, C2B, C3B corresponding to those shown in the charge pump 14 of FIG. 5. The perspective of FIG. 6, as well as the subsequent figures, limits visibility of the charge-transfer capacitors C1A, C2A, C3A, C1B, C2B, C3B to only first and second charge-transfer capacitors C1A, C2A.

The charge-transfer capacitors C1A, C2A, C3A, C1B, C2B, C3B and the inductor L1 are mounted on a printed-circuit board 62 along with a first die 60. The first die 60 includes a power-management integrated circuit having circuitry to implement the switches 1, 2 as well as circuitry to implement the control system 36.

The two downwardly facing arrows indicate that the actual transistors to implement the switches 1, 2 are found on the lower face of the first die 60. This face, will be referred to herein as the "device face." The pair of arrows shown will identify the device face in the following figures.

Figure 7:
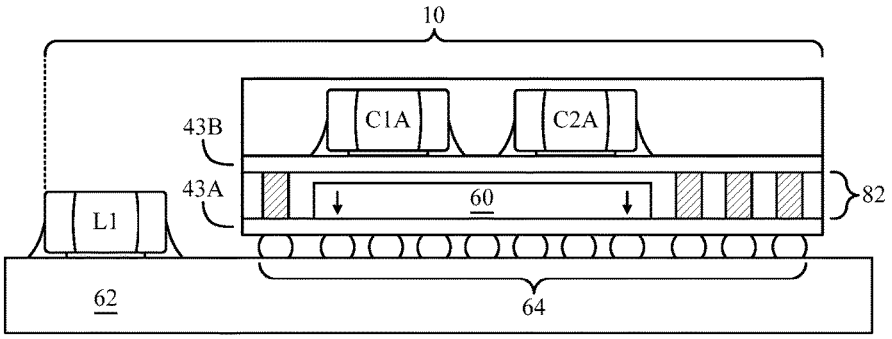
FIG. 7 shows a side-view of an implementation of one of the architectures shown in FIGS. 2-4 in which selected components of the power converter are in a two-layer package.

Solder bumps 64 provide connections between the first die 60 and the printed-circuit board 62. In the embodiment of FIG. 7, these solder bumps 64 provide electrical connections. However, in other embodiments, solder bumps provide an avenue for heat dissipation.

FIG. 7 is a side-view of an implementation similar to that shown in FIG. 6. In FIG. 7, the inductor L1 remains mounted on the printed-circuit board 62. However, the charge-transfer capacitors C1A, C2A, C3A, C1B, C2B, C3B and the first die 60 are now on separate layers of a two-layer package. This reduces the distance between the switches and capacitors in a network such as that shown in FIG. 5. It also reduces the footprint of the power converter 10. Since the first die 60 can be very thin, the overall thickness of the embodiment shown in FIG. 7 is not much greater than that of the embodiment shown in FIG. 6.

A substrate 82 within the package supports the charge-transfer capacitors C1A, C2A, C3A, C1B, C2B, C3B in the package's upper layer. These charge-transfer capacitors C1A, C2A are discrete elements that, in some embodiments, are encapsulated in a protection compound such as an epoxy. The first die 60 is embedded within the substrate 82 to form the package's lower layer.

The package also includes upper and lower interconnect layers 43A, 43B on opposite sides of the substrate 82. The lower interconnect layer 43A permits connection to the transistors on a lower face of the first die 60. The upper interconnect layer 43B provides connections to the charge-transfer capacitors C1A, C2A, C3A, C1B, C2B, C3B in the package's upper layer. A number of conductive vias extend through the substrate 82 to provide electrical communication between the upper and lower interconnect layers 43A, 43B.

An advantage of the configuration shown in FIG. 7 is that the overall power-converter 10 will have a smaller footprint than that shown in the implementation of FIG. 6. On the other hand, the implementation shown in FIG. 6 would be easier to manufacture and would result in a lower profile power-converter 10.

Figure 8:
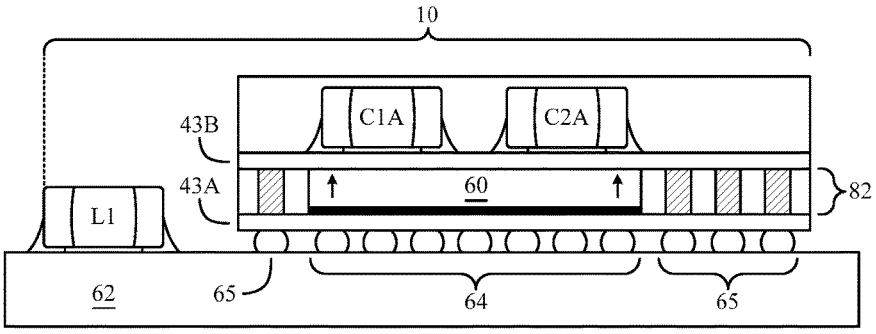
FIG. 8 shows side-view of an implementation similar to that of FIG. 7, but with the device face of the die being the upper face instead of the lower face.

FIG. 8 shows an implementation similar to that shown in FIG. 7, but with the device face now being on an upper face of the first die 60. Electrically conductive bumps 65 provide electrical connections between the lower interconnect layer 43A and the printed circuit board 62. This permits electrical communication between the packaged components and external components. These external components would include the inductor L1, which remains mounted on the printed-circuit board 62.

The lower interconnect layer 43A also provides an avenue for heat dissipation for the first die 60 via thermally-conductive bumps 64 that connect the first die's lower face to the printed-circuit board 62.

Figure 9:
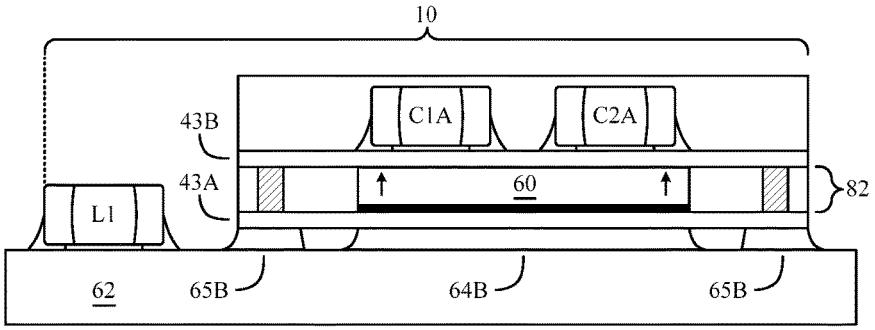
FIG. 9 shows a side-view of an implementation similar to that of FIG. 8, but with conductive pads instead of solder bumps to provide a connection with the printed-circuit board.

FIG. 9 shows an embodiment similar to that shown in FIG. 8, but with an electrically-conductive pad 65B replacing the electrically-conductive bumps 65 and a single thermally-conductive pad 64B replacing the thermally-conductive bumps 64. Because all of the electrical connections are on the edges, this type of package can be optically inspected. Instead of having to carry out the more expensive x-ray inspection procedure that would be required by the package shown in FIG. 8, which contains hidden solder bumps.

Figure 10:
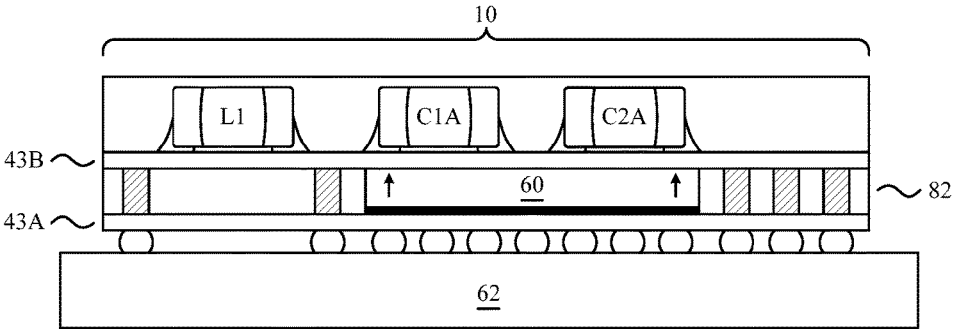
FIG. 10 shows an implementation similar to that of FIG. 8, but with the inductor having been incorporated into the package's upper layer.

FIG. 10 shows an embodiment similar to that shown in FIG. 8, but with the inductor L1 no longer being on the printed-circuit board 62. Instead, the inductor L1 has been incorporated into the package's upper layer. Since inductors are typically taller than capacitors, the embodiment shown in FIG. 10 embodiment will typically be taller than the one in FIG. 8. However, since all of the components are in the same package, the system can be tested as whole. This ensures higher quality and reliability.

Figure 11:
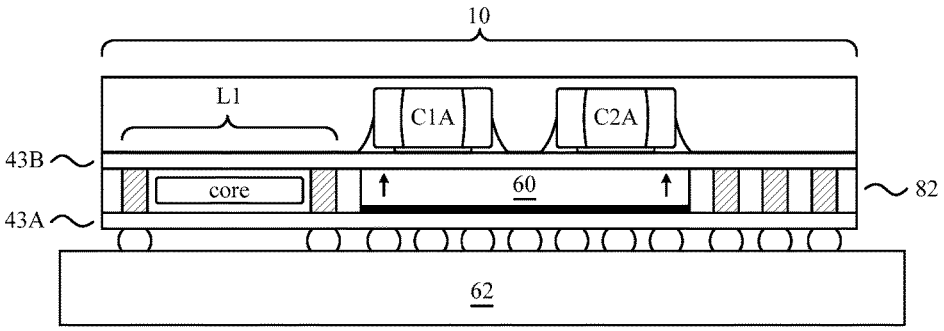
FIG. 11 shows an implementation similar to that of FIG. 8, but with the inductor having been incorporated into the package's lower layer.

FIG. 11 shows an embodiment similar to that of FIG. 10, but with the inductor L1 having been integrated into the substrate 82. The inductor L1 is implemented as a coil that is formed around a magnetic core using the lower interconnect layer 43A, the upper interconnect layer 43B, and conductive vias. This is embodiment is particularly useful for forming a large number of low-inductance inductors.

Figure 12:
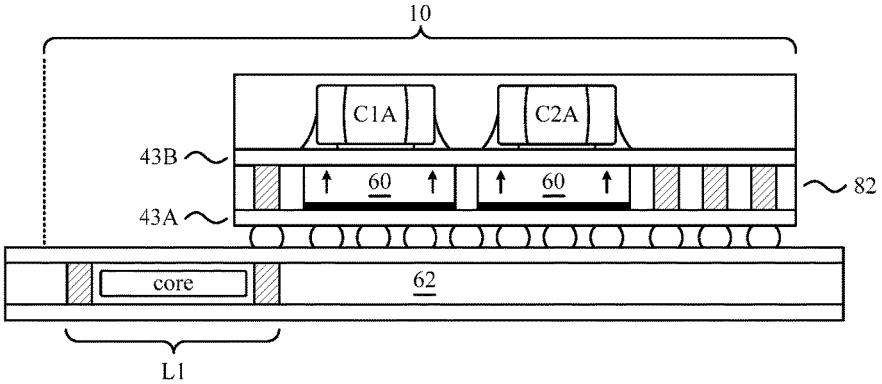
FIG. 12 shows an implementation similar to that of FIG. 8, but with the inductor having been incorporated into the printed-circuit board.
Figure 13:
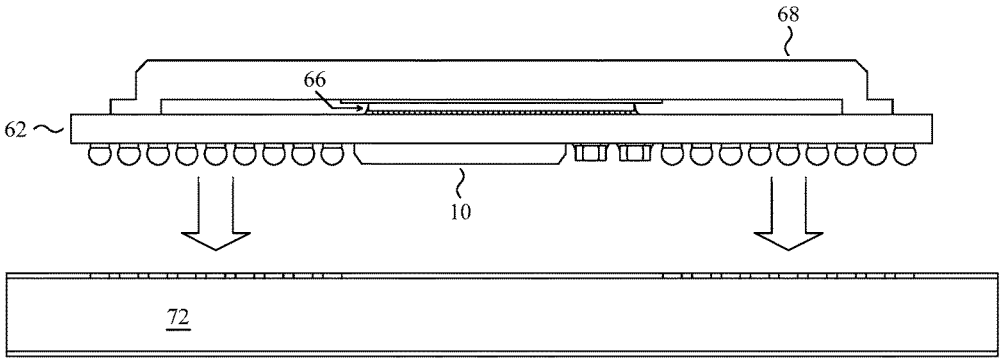
FIG. 13 shows the power converter as part of a larger package that includes a load to that consumes power provided by the power converter, with the power converter being sufficiently low profile to fit in an accommodating space provided by the solder bumps.

FIG. 12 shows an embodiment similar to that shown in FIG. 11, but with the inductor L1 having been integrated into the main printed-circuit board 62 and with the first die 60 having been split into two separate dies. There are numerous possibilities for the how the first die 60 can be split. In some embodiments, one die includes circuitry for implementing control system 36 and the other die includes switches that form part of the regulator 12 and the charge pump 14. In another embodiment, one die includes the regulator 12 and the regulator controller 38 while the other die includes the charge pump 14 and the charge-pump controller 40.

FIGS. 13-17 show the power converters 10 of FIGS. 6-12 as part of a larger package. To establish a frame of reference, the printed-circuit board 62 from FIGS. 6-12 can be seen in each of FIGS. 13-17. As is apparent, the power converter 10 shown in FIGS. 6-12 is oriented upside-down in FIGS. 13-17.

As can now be seen in FIGS. 13-17, the printed-circuit board 62 has a lower face and an upper face. The lower face carries the power converter 10 and numerous interconnecting structures for connecting the printed-circuit board 62, and all components thereon, to a motherboard 72. Although only one power converter 10 is shown, this is only an accident of perspective. It is quite possible for there to be multiple power converters, as shown for example in FIG. 18.

The upper face supports a second die 66 and a heat spreader 68 that drains heat from the second die 66. The second die has circuitry that is to consume power provided by the power converter 10. It therefore corresponds to the load shown in FIG. 1. In some embodiments, the power-consuming circuitry within the second die 66 includes a microprocessor. In other embodiments, it includes a field-programmable gate array.

Since the power converter 10 is on the lower face of the printed-circuit board 62, some kind of accommodating space must be provided to receive the power converter 10. In the embodiment shown in FIG. 13, the power converter 10 has a low-profile so that it fits in an accommodating space formed by the solder bumps themselves. In the embodiment shown in FIG. 14, a hole 74 in the motherboard 72 provides the accommodating space. In the embodiment shown in FIG. 15, sockets 76 instead of solder bumps 70 engage the printed-circuit board 62 onto a motherboard 72. In this embodiment, there is no need to perforate the motherboard 72. Instead, an accommodating space 78 between the sockets 76 receives the power converter 10.

In the embodiments discussed thus far, the first die 60 is mounted on the lower face of the printed-circuit board 62. However, this need not be the case. In some embodiments, the first die can be mounted on the upper face of the printed-circuit board beside the second die 66. Moreover, the first die 60 can be split to form a plurality of first dies 60, each with different portions of the power-management integrated circuitry. An embodiment having a plurality of first dies 60 on the upper face of the printed-circuit board [72] *62* can be seen in FIG. 16. The first dies 60 include the active components of the power-management integrated circuit, such as the switches 1, 2 and the control system 36. The passive components 80 remain on the lower face of the printed-circuit board [72] *62*, where they fit into an accommodating space, such as the hole 74 in the motherboard 72. In this embodiment, the heat spreader 68 drains heat from both the first dies 60 and the second die 66.

Figure 17:
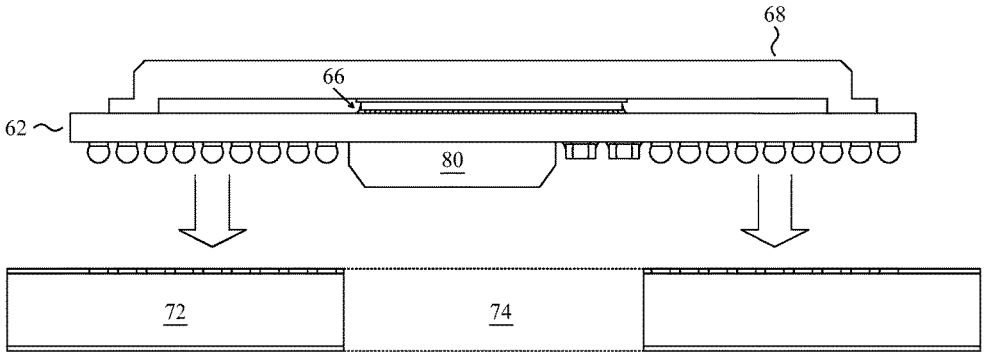
FIG. 17 shows an embodiment similar to that shown in FIG. 13, but with the power converter's power-management circuitry having been separated into active devices mounted inside the load, and their corresponding passive components, which remain beneath the load.

FIG. 17 shows an embodiment in which the active components of the power-management integrated circuit, such as the switches 1, 2 and the control system 36, have been integrated into the second die 66. The passive components 80 remain on the lower face of the printed-circuit board [72] *62*, where they fit into an accommodating space, such as the hole 74 in the motherboard 72.

Figure 14:
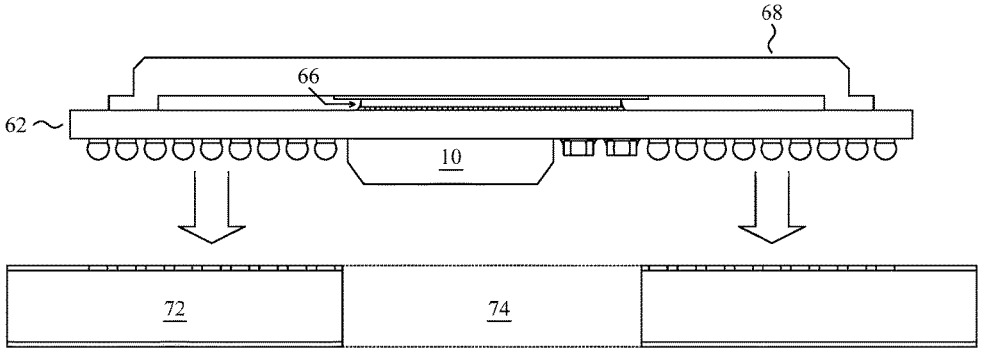
FIG. 14 shows an embodiment similar to that of FIG. 13, but with the power converter received by a hole in a motherboard.
Figure 15:
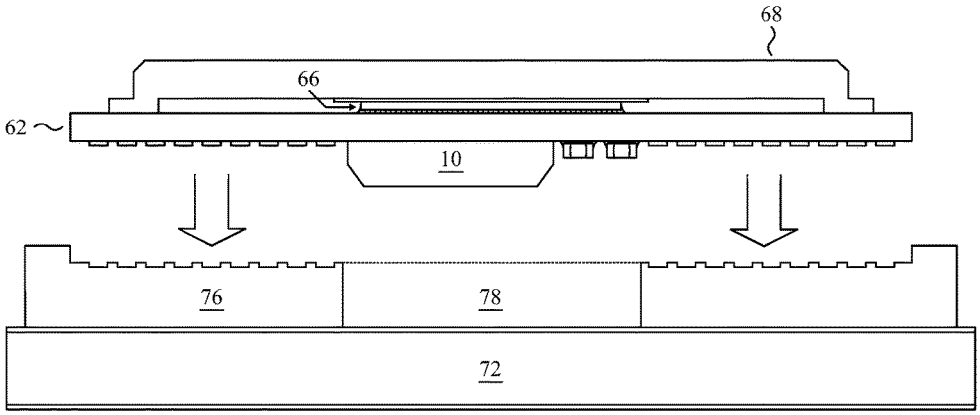
FIG. 15 shows an embodiment similar to that of FIG. 13, but with the power converter received by a recess formed by a socket layer.
Figure 16:
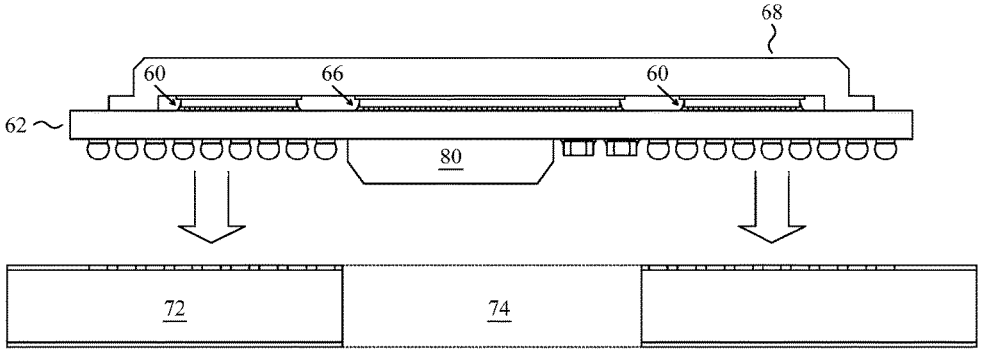
FIG. 16 shows an embodiment similar to that shown in FIG. 13, but with the power converter's power-management circuitry having been separated into active devices mounted beside the load, and their corresponding passive components, which remain beneath the load.
Figure 18:
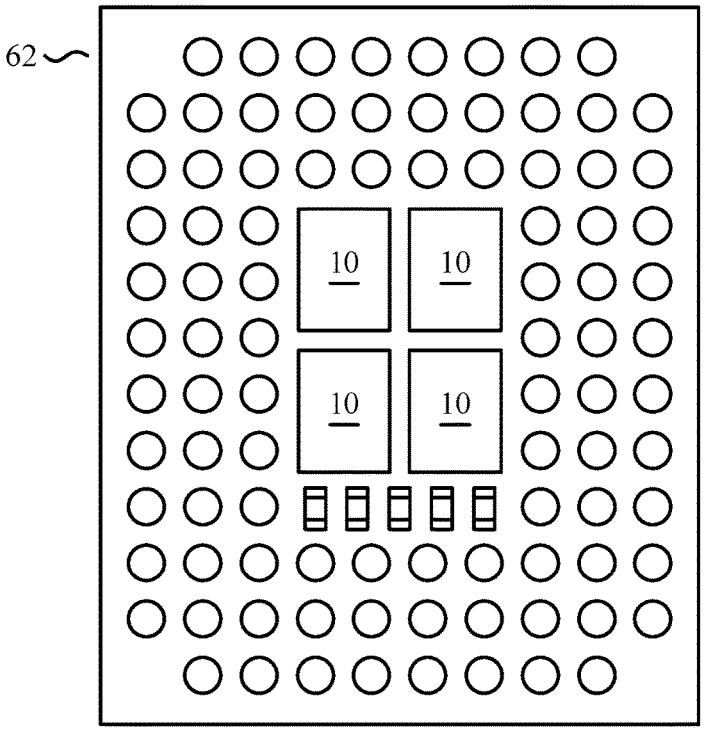
FIG. 18 shows a plan view of any of the embodiments in FIG. 13 with four power converters.

FIG. 18 shows a view looking toward the bottom face of the printed-circuit board 62 in a typical implementation such as that shown in FIG. 14. The printed-circuit board 62 shows four power converters 10 adjacent to five coupling capacitors and surrounded by numerous terminals, which include ground terminals, power terminals, and I/O terminals.

In some implementations, a computer accessible storage medium includes a database representative of one or more components of the converter. For example, the database may include data representative of a switching network that has been optimized to promote low-loss operation of a charge pump.

Generally speaking, a computer accessible storage medium may include any non-transitory storage media accessible by a computer during use to provide instructions and/or data to the computer. For example, a computer accessible storage medium may include storage media such as magnetic or optical disks and semiconductor memories.

Generally, a database representative of the system may be a database or other data structure that can be read by a program and used, directly or indirectly, to fabricate the hardware comprising the system. For example, the database may be a behavioral-level description or register-transfer level (RTL) description of the hardware functionality in a high level design language (HDL) such as Verilog or VHDL. The description may be read by a synthesis tool that may synthesize the description to produce a netlist comprising a list of gates from a synthesis library. The netlist comprises a set of gates that also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, Alternatively, the database may itself be the netlist (with or without the synthesis library) or the data set.

Having described the invention, and a preferred embodiment thereof, what is claimed as new, and secured by Letters Patent is:

1. An apparatus comprising a charge pump for use in a power converter, said charge pump [being] packaged with a load [that receives] *configured to receive* charge provided by said charge pump, said charge pump comprising a plurality of switches [that] *configured to*, when connected to a plurality of capacitors, cause said plurality of capacitors to assume a selected configuration *of a plurality of configurations*, said switches [being] configured to cause transitions between said *plurality of* configurations of said capacitors, *said apparatus further comprising a printed-circuit board having opposed first and second faces and a first die protruding from said first face,* wherein said charge pump comprises a first terminal and a second terminal, [and]

wherein said charge pump [transforms] *configured to transform* a first voltage at said first terminal into a second voltage at said second terminal, wherein the charge pump is configured such that at least some charge that leaves said charge pump passes through an inductor[.],

*wherein said power converter comprises a power-converter controller and said charge pump, wherein said power-converter controller comprises a charge-pump controller configured to control said charge pump,*

*wherein at least a portion of said power converter protrudes from said second face,*

*wherein said printed-circuit board is configured to be mounted in electrical communication with a motherboard, and*

*wherein said second face is configured to face said motherboard, and wherein an accommodation space is configured to receive said at least a portion of said power converter.*

[2. The apparatus of claim 1, further comprising a power converter, said power converter comprising a power-converter controller, said charge pump, and a regulator, wherein said power-converter controller comprises a regulator-controller that controls said regulator and a charge-pump controller that controls said charge pump.]

3. The apparatus *of* claim [2] *1*, wherein said power converter further comprises a magnetic filter, wherein [said] *a* regulator is coupled to an input of said charge pump [and] , *wherein* said magnetic filter is coupled to an output of said charge pump[, wherein power that passes through said regulator bypasses said charge pump and said magnetic filter.].

4. The apparatus of claim 1, further comprising [a printed-circuit board, a motherboard, solder bumps, and a first die, wherein said printed-circuit board comprises a first face and a second face opposed to said first face] *solder bumps*, wherein said first die comprises circuitry [that consumes] *configured to consume* power provided by said power converter, [wherein said first die protrudes from said first face, wherein said power converter protrudes from said second face,] wherein said solder bumps protrude from said second face, wherein an extent to which said power converter protrudes from said second face is less than an extent to which said solder bumps protrude from said second face, whereby, when said printed-circuit board is mounted to said motherboard with said second face facing said motherboard, a gap formed by said solder bumps is sufficient to accommodate said power converter.

5. The apparatus of claim 1, further comprising a [printed-circuit board, a motherboard, a socket layer, and a first die, wherein said printed-circuit board comprises a first face and a second face opposed to said first face] *socket layer*, wherein said socket layer is disposed on said motherboard, wherein said socket layer defines a recess, wherein said first die comprises circuitry [that consumes] *configured to consume* power provided by said power converter, [wherein said first die protrudes from said first face, wherein said power converter protrudes from said second face,] wherein, when said printed-circuit board is mounted to said socket layer with said second face facing said motherboard, said recess defined by said socket layer [accommodates] *is configured to accommodate* said power converter.

6. The apparatus of claim 1, [further comprising a printed-circuit board, a motherboard, and a first die,] wherein said motherboard defines [an] *the* accommodation space, wherein said power converter comprises plural second dies and passive components, wherein said second dies comprise active elements of said power converter, [wherein said printed-circuit board comprises a first face and a second face opposed to said first face,] wherein said first die comprises circuitry [that consumes] *configured to consume* power provided by said power converter, [wherein said first die protrudes from said first face,] wherein said second dies [protrudes] *protrude* from said first face, wherein said passive components protrude from said second face, wherein, when said printed-circuit board is mounted to said motherboard with said second face facing said motherboard, said accommodation space [accommodates] *is configured to accommodate* said passive components.

7. The apparatus *of* claim [2] *1*, wherein said power converter further comprises a magnetic filter coupled to an output of said charge pump, *wherein* an input of [which couples] *the charge pump is coupled* to [said] *a* regulator, wherein [power that passes through said regulator passes through said charge pump and said magnetic filter.] *the charge pump is configured to receive an output voltage of the regulator, and wherein the magnetic filter is configured to receive an output voltage of the charge pump.*

8. The apparatus of claim 1, wherein said switches define plural paths along which charge stored in said capacitors is transferred between said first and second terminals.

9. An apparatus comprising a charge pump*, a printed circuit board, a motherboard, and a first die* for use in a power converter, said charge pump [being] packaged with a load [that receives] *configured to receive* charge provided by said charge pump, said charge pump comprising a plurality of switches [that] *configured to*, when connected to a plurality of capacitors, cause said plurality of capacitors to assume a selected configuration *of a plurality of configurations*, said switches [being] configured to cause transitions between said *plurality of* configurations of said capacitors, wherein said charge pump comprises a first terminal and a second terminal, and wherein said charge pump [transforms] *is configured to transform* a first voltage at said first terminal into a second voltage at said second terminal, said apparatus further comprising a magnetic filter connected to said charge pump thereby causing said charge pump to operate at least partially adiabatically[.],

*wherein said power converter comprises a power-converter controller and said charge pump,*

*wherein said power-converter controller comprises a charge-pump controller configured to control said charge pump,*

*wherein said printed circuit board comprises a first face and a second face opposed to said first face,*

*wherein said motherboard comprises walls forming a hole therethrough,*

*wherein said first die comprises circuitry configured to consume power provided by said power converter,*

*wherein said first die is coupled to said printed circuit board, and*

*wherein, when said printed circuit board is mounted to said motherboard with said second face facing said motherboard, said hole is configured to accommodate said power converter.*

10. The apparatus of claim 9, further comprising a communication link between [a] *the charge pump* controller [of said charge pump] and said load *and configured* to receive instructions from said load.

11. The apparatus of claim 9, further comprising a regulator connected to said charge pump.

12. The apparatus of claim 9, [further comprising a printed-circuit board, a motherboard, and a first die, wherein said printed-circuit board comprises a first face and a second face opposed to said first face, wherein said motherboard comprises walls forming a hole therethrough, wherein said first die comprises circuitry that consumes power provided by said power converter,] wherein said first die protrudes from said first face, wherein said power converter protrudes from said second face[, wherein, when said printed-circuit board is mounted to said motherboard with said second face facing said motherboard, said hole accommodates said power converter].

13. The apparatus of claim 9, [further comprising a printed-circuit board, a motherboard, and a first die,] wherein said motherboard defines an accommodation space, wherein said power converter comprises a second die and passive components, wherein said second die comprises active elements of said power converter, [wherein said printed-circuit board comprises a first face and a second face opposed to said first face, wherein said first die comprises circuitry that consumes power provided by said power converter,] wherein said first die protrudes from said first face, wherein said second die protrudes from said first face, wherein said passive components protrude from said second face, wherein, when said printed-circuit board is mounted to said motherboard with said second face facing said motherboard, said accommodation space [accommodates] *is configured to accommodate* said passive components.

14. The apparatus of claim 13, further comprising a heat spreader disposed to be in thermal communication with both said first die and said at least one second die.

15. An apparatus comprising a charge pump for use in a power converter, said charge pump [being] packaged with a load [that receives] *configured to receive* charge provided by said charge pump, said charge pump comprising a plurality of switches [that] *configured to*, when connected to a plurality of capacitors, cause said plurality of capacitors to assume a selected configuration *of a plurality of configurations*, said switches [being] configured to cause transitions between said *plurality of* configurations of said capacitors, wherein said charge pump comprises a first terminal and a second terminal, and wherein said charge pump [transforms] *is configured to transform* a first voltage at said first terminal into a second voltage at said second terminal, said apparatus further comprising a printed-circuit board having opposed first and second faces and a first die protruding from said first face, wherein at least a portion of said power converter protrudes from said second face, wherein said printed-circuit board is *configured to be* mounted [to be] in electrical communication with [said] *a* motherboard, wherein said second face [faces] *is configured to face* said motherboard, and wherein an accommodation space [receives] *is configured to receive* said at least a portion of said power converter.

16. The apparatus of claim 15, wherein said power converter comprises a second die, a charge-transfer capacitor, and an inductor, wherein said power converter is *configured to be* controlled by a power-converter controller that comprises circuitry on said second die, wherein said charge-transfer capacitor is a constituent of said charge pump, wherein said inductor is a constituent of a regulator, and wherein said second die, said inductor, and said charge-transfer capacitor are mounted on said first face of said printed-circuit board.

17. The apparatus of claim 15, wherein said power converter comprises a package, a second die, a charge-transfer capacitor, and an inductor, wherein said package comprises a substrate that defines an upper layer and a lower layer, wherein *said power converter is configured to be controlled by* a power-converter controller that [controls said power converter] comprises circuitry on said second die, wherein said charge-transfer capacitor is a constituent of said charge pump, wherein said inductor is a constituent of said regulator that is connected to said charge pump, wherein said package is mounted on said first face of said printed-circuit board, wherein said second die is integrated into said lower layer, and wherein said charge-transfer capacitor is integrated into said upper layer.

18. The apparatus of claim 15, wherein said power converter further comprises a second die, a package, and first and second interconnect layers within said package, wherein said second die has a device face that faces one of said first and second interconnect layers, wherein said first interconnect layer is connected to said printed-circuit board to provide a connection to said second interconnect layer, wherein, when said device face of said second die faces said first interconnect layer, said second interconnect layer connects only to components in said upper layer, and wherein, when said device face of said second die faces said second interconnect layer, said second interconnect layer connects to components in an upper layer of said upper layer and to said second die.

19. The apparatus of claim 15, wherein said power converter further comprises thermally-conducting bumps or a thermally-conducting pad configured to provide a path for heat to flow to said printed-circuit board.

20. The apparatus of claim 15, wherein said first die comprises an array of logic gates and a clock, wherein said array is configured to load and execute instructions in synchrony with a clock signal provided by said clock.

21. The apparatus of claim 15, wherein said first die comprises an array of programmable logic gates.

22. The apparatus of claim 15, wherein said power converter further comprises a thermally-conducting pad configured to provide a path for heat to flow to said printed-circuit board.

*23. A power-management system comprising:*

*one or more switched-capacitor networks coupled to a load via a conductive path, a particular switched-capacitor network of the one or more switched-capacitor networks having a voltage input, an at least one discrete passive device, a plurality of switches coupled to the at least one discrete passive device, and a voltage output coupled to the load, wherein the one or more switched-capacitor networks are configured such that at least some charge that leaves the one or more switched-capacitor networks passes through an inductor; and*

*a package coupled to a printed circuit board, the package having a first terminal coupled to a power supply and to the voltage input and a second terminal coupled to ground, the package comprising:*

*the plurality of switches,*

*a high voltage path to couple the voltage input and the voltage output, and*

*a low voltage path to couple the ground and the voltage output,*

*wherein the at least one discrete passive device is coupled to the package, and wherein the at least one discrete passive device comprises at least one capacitor directly connected between the high voltage path and the low voltage path.*

*24. The power-management system of claim 23, wherein the plurality of switches are operable to alternately transition the at least one discrete passive device between selected configurations.*

*25. The power-management system of claim 24, wherein the package comprises a two-layer package, and wherein the plurality of switches and the at least one discrete passive device are on different layers of the two-layer package.*

*26. The power-management system of claim 23, wherein the one or more switched-capacitor networks are configured to respectively transform a first voltage into one or more second voltages.*

*27. The power-management system of claim 26, wherein the first voltage is to be received via the voltage input.*

*28. The power-management system of claim 26, wherein the load is configured to respectively receive different output voltages at different times based, at least in part, on the one or more second voltages.*

*29. The power-management of claim 28, wherein the different output voltages comprise one or more regulated voltages to be provided via one or more regulators based, at least in part, on the one or more second voltages.*

*30. The power-management system of claim 29, wherein the one or more regulators are coupled to the one or more switched-capacitor networks via one or more nodes, the one or more nodes configured to receive the one or more second voltages.*

*31. The power-management system of claim 28, wherein the load is configured to respectively receive the different output voltages via the conductive path.*

*32. The power-management system of claim 28, wherein the one or more switched-capacitor networks are for use with at least one power converter, the at least one power converter to be included in the package and communicatively coupled to at least one controller operable to maintain the different output voltages within predetermined ranges based, at least in part, on one or more control signals.*

*33. A method of making the power-management system of claim 23, the power-management system comprising:*

*one or more switched-capacitor networks coupled to a load via a conductive path, a particular switched-capacitor network of the one or more switched-capacitor networks having a voltage input, an at least one discrete passive device, a plurality of switches coupled to the at least one discrete passive device, and a voltage output coupled to the load, wherein the one or more switched-capacitor networks are configured such that at least some charge that leaves the one or more switched-capacitor networks passes through and inductor; and*

*a package coupled to a printed circuit board, the package having a first terminal coupled to a power supply and to the voltage input and a second terminal coupled to ground, the package comprising:*

*the plurality of switches,*

*a high voltage path to couple the voltage input and the voltage output, and*

*a low voltage path to couple the ground and the voltage output,*

*wherein the at least one discrete passive device is coupled to the package, and wherein the at least one discrete passive device comprises at least one capacitor directly connected between the high voltage path and the low voltage path;*

*the method comprising:*

*forming the package;*

*coupling the package to the printed circuit board; and*

*directing connecting the at least one discrete passive device between the high voltage path of the package and the low voltage path of the package.*

*34. A method of operating the power-management system of claim 23, the power-management system comprising:*

*one or more switched-capacitor networks coupled to a load via a conductive path, a particular switched-capacitor network of the one or more switched-capacitor networks having a voltage input, an at least one discrete passive device, a plurality of switches coupled to the at least one discrete passive device, and a voltage output coupled to the load, wherein the one or more switched-capacitor networks are configured such that at least some charge that leaves the one or more switched-capacitor networks passes through an inductor; and*

*a package coupled to a printed circuit board, the package having a first terminal coupled to a power supply and to the voltage input and a second terminal coupled to ground, the package comprising:*

*the plurality of switches,*

*a high voltage path to couple the voltage input and the voltage output, and*

*a low voltage path to couple the ground and the voltage output,*

*wherein the at least one discrete passive device is coupled to the package, and wherein the at least one discrete passive device comprises at least one capacitor directly connected between the high voltage path and the low voltage path;*

*the method comprising:*

*selectively opening and closing each of the plurality of switches to selectively couple the at least one discrete passive device to the voltage input and/or the voltage output utilizing the high voltage path and the low voltage path; and*

*transforming a first voltage at the voltage input to a second voltage at the voltage output based on the selectively opening and closing of each of the plurality of switches.*

*35. A method comprising:*

*selectively opening and closing each of a plurality of switches of a particular switched-capacitor network of one or more switched-capacitor networks to selectively couple at least one discrete passive device of the particular switched-capacitor network to a voltage input of the particular switched-capacitor network and/or a voltage output of the particular switched-capacitor network utilizing a high voltage path of a package and a low voltage path of the package, wherein the package is coupled to a printed circuit board, wherein the package comprises the plurality of switches, a first terminal coupled to a power supply and to the voltage input, a second terminal coupled to ground, the high voltage path to couple the voltage input and the voltage output, and the low voltage path to couple the ground and the voltage output, wherein the voltage output is coupled to a load, wherein the one or more switched-capacitor networks are coupled to the load via a conductive path, and wherein a magnetic filter is connected to the one or more switched-capacitor networks thereby causing the one or more switched-capacitor networks to operate at least partially adiabatically; and*

*transforming a first voltage at the voltage input to a second voltage at the voltage output based on the selectively opening and closing of each of plurality of switches, wherein the at least one discrete passive device is coupled to the package, and wherein the at least one discrete passive device comprises at least one capacitor directly connected between the high voltage path and the low voltage path.*

* * * * *